(12) United States Patent
Wu et al.

(10) Patent No.: US 7,598,157 B2
(45) Date of Patent: Oct. 6, 2009

(54) WAFER DICING METHOD

(75) Inventors: Chih-Hung Wu, Taoyuan County (TW); Chieh Cheng, Taoyuan County (TW); Kai-Sheng Chang, Taoyuan County (TW); Kuan-Yu Chu, Taoyuan County (TW)

(73) Assignee: Atomic Energy Countil-Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 11/798,503

(22) Filed: May 14, 2007

(65) Prior Publication Data

US 2008/0286946 A1    Nov. 20, 2008

(51) Int. Cl.
*H01L 21/00* (2006.01)

(52) U.S. Cl. .............. 438/464; 438/460; 438/462; 257/E21.599

(58) Field of Classification Search .............. 438/458, 438/460, 462, 464; 257/E21.599
See application file for complete search history.

(56) References Cited

U.S. PATENT DOCUMENTS

| | | | | |
|---|---|---|---|---|
| 4,296,542 | A * | 10/1981 | Gotman | 438/17 |
| 5,362,681 | A * | 11/1994 | Roberts et al. | 438/464 |
| 6,563,204 | B1 * | 5/2003 | Glenn | 257/678 |
| 2007/0275544 | A1 * | 11/2007 | Maki et al. | 438/464 |

* cited by examiner

*Primary Examiner*—George Fourson
*Assistant Examiner*—John M Parker

(57) ABSTRACT

A wafer stacked on a mounting layer is safely diced. The mounting layer has holes partially corresponding to chips on the wafer. Thus, chips obtained after dicing the wafer can be safely removed from the mounting tape. An amount of the mounting tape used can be reduced. And a production cost can be lowered as well.

5 Claims, 6 Drawing Sheets

WAFER DICING METHOD

FIELD OF THE INVENTION

The present invention relates to wafer dicing; more particularity, relates to dicing a wafer with an effective control to prevent a crack of chip on being removed from a mounting tape; reducing an amount of the mounting tape used; and lowering a production cost.

DESCRIPTION OF THE RELATED ART

As shown in FIG. 5, a wafer 3 is usually pasted with a mounting tape 31 on a surface to be diced to obtain chips 32. The chip 32 cut out is then removed from the mounting tape 31, where the mounting tape 31 is used to protect the chip 32.

Although the mounting tape 31 is used to protect the chip 32 on dicing the wafer 3, the stickiness between the chip 32 and the mounting tape 31 is usually too strong. It is because the chip 32 has a small thickness and a smooth surface. As a result, the chip 32 cut out has a difficulty on being removed from the mounting tape 31 and thus has a problem in being apt to be broken on the removing. Hence, the prior art does not fulfill all users' requests on actual use.

SUMMARY OF THE INVENTION

The main purpose of the present invention is to dice a wafer with an effective control on the cutting depth through partially corresponding a plurality of holes to a plurality of chips on the wafer, where a crack of the chip is prevented on removing the chip from a mounting tape; an amount of the mounting tape used is reduced; and a production cost is lowered.

To achieve the above purpose, the present invention is a wafer dicing method, where a wafer is stacked on a mounting layer; a plurality of chips to be cut out is located on the wafer; the mounting layer has a plurality of holes; the holes are partially corresponding to the chips; and then the wafer is diced with a cutting device to obtain the chips. Accordingly, a novel wafer dicing method is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is the sectional view showing the wafer used in the preferred embodiment according to the present invention;

DESCRIPTION OF THE PREFERRED EMBODIMENT

The following description of the preferred embodiment is provided to understand the features and the structures of the present invention.

Figure 1:
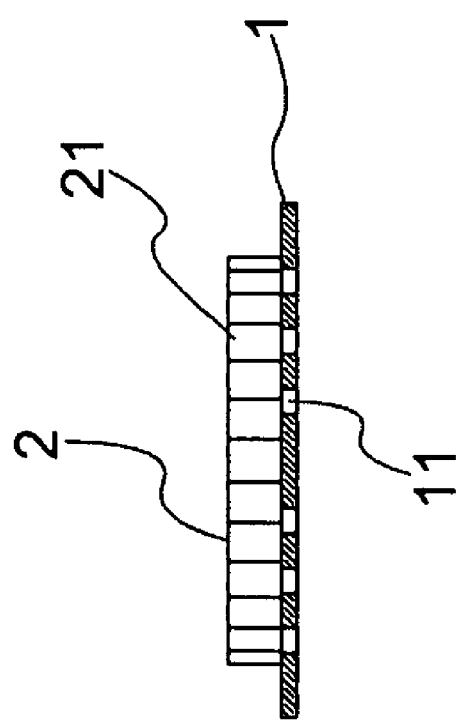

Please refer to FIG. 1, which is a sectional view showing a wafer used in a preferred embodiment according to the present invention. As shown in the figure, the present invention is a wafer dicing method, comprising the following steps:

(a) A wafer 2 having a plurality of chips 21 on a surface to be diced is stacked on a mounting layer 1, where the mounting layer 1 has a thickness between 10 and 200 micrometers; the mounting layer has a plurality of holes 11; the holes 11 are partially corresponding to the chips 21; and the chips 21 and the holes 11 have a partial contact whose ratio is between 1 and 50 percents.

(b) Then the chips 21 on the wafer 2 are diced by a dicing device (not shown in the figure).

With the holes 11 partially corresponding to the chips 21 on the mounting layer 1, the mounting layer 1 is easily removed after the dicing, where a crack of the chip 21 is prevented; an amount of a mounting tape used is reduced; and thus a production cost is reduced as well. Thus, a novel wafer dicing method is obtained.

Figure 2A:
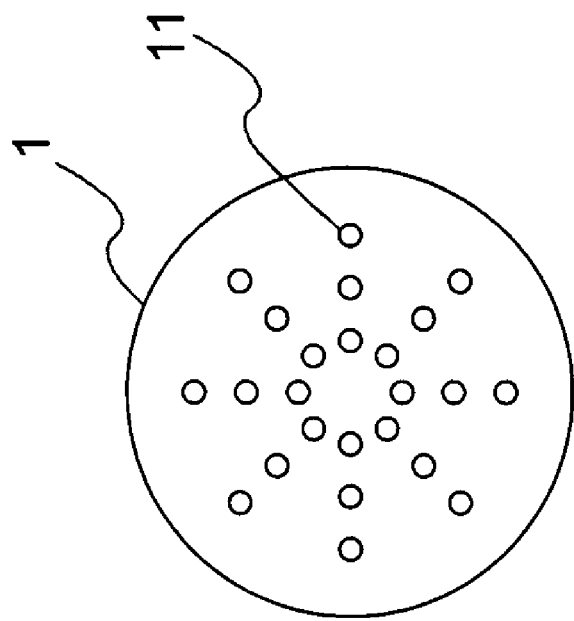
FIG. 2A and FIG. 2B are the views showing the holes arranged into circles and dense circles on the first preferred embodiment of the mounting layer.
Figure 2B:
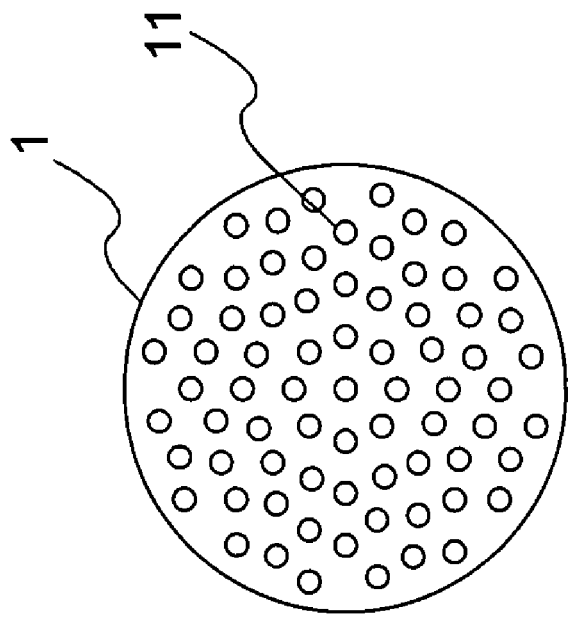

Please refer to FIG. 2A and FIG. 2B, which are views showing holes arranged into circles and dense circles on a first preferred embodiment of a mounting layer. As shown in the figures, holes 11 of a mounting layer 1 is arranged into a few orderly circles, as shown in FIG. 2A. And the circles can also be densely arranged, as shown in FIG. 2B.

Figure 3:
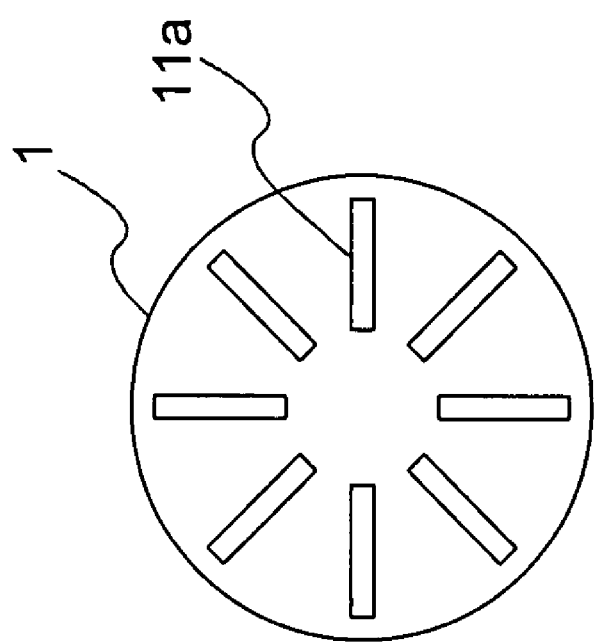
FIG. 3 is the view showing the second preferred embodiment of the mounting layer.

Please refer to FIG. 3, which is a view showing a second preferred embodiment of the mounting layer. As shown in the figure, holes 11a of a mounting layer 1 is arranged into a few orderly rectangles according to an actual need.

Figure 4:
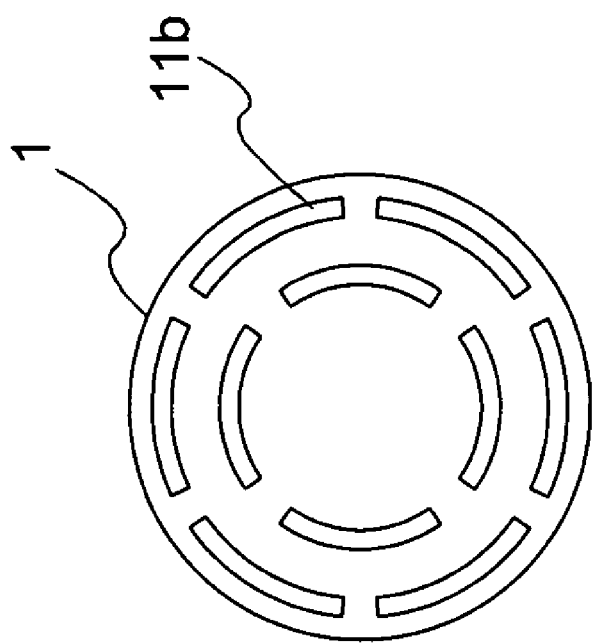
FIG. 4 is the view showing the second preferred embodiment of the mounting layer.
Figure 5:
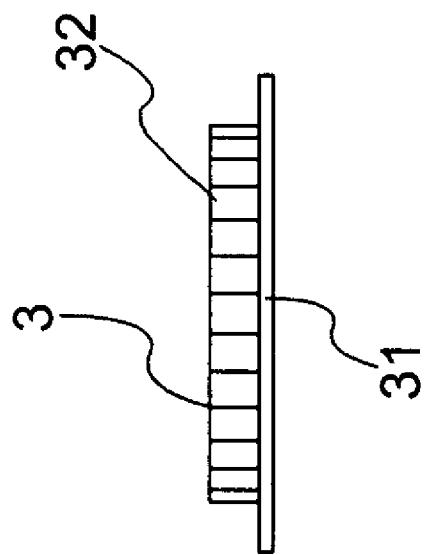
FIG. 5 is the sectional view of the wafer of the prior art.

Please refer to FIG. 4, which is a view showing a third preferred embodiment of the mounting layer. As shown in the figure, holes 11b of a mounting layer 1 is arranged into a few orderly arcs according to an actual need.

To sum up, the present invention is a wafer dicing method, where a crack of a chip on being removed from a mounting tape after the dicing is prevented with holes partially corresponding to the chips to be diced; an amount of the mounting tape used is reduced; and thus a production cost is lowered as well.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A wafer dicing method, comprising steps of:
    (a) deposing a wafer on a mounting layer, said wafer having a plurality of chips located on a surface of said wafer, said mounting layer having a plurality of holes, said holes being partially corresponding to said chips; and
    (b) cutting said wafer with a cutting device to obtain said plurality of chips,
    wherein said chips on said wafer and said holes on said mounting layer have a contact area having a ratio between 1 percent and 50 percent.

2. The method according to claim 1, wherein said mounting layer has a thickness between 10 and 200 micrometers.

3. The method according to claim 1, wherein said plurality of holes on said mounting layer has an arrangement of orderly circles.

4. The method according to claim 1, wherein said plurality of holes on said mounting layer has an arrangement of orderly rectangles.

5. The method according to claim 1, wherein said plurality of holes on said mounting layer has an arrangement of orderly arcs.

* * * * *